(12) United States Patent
Forbes

(10) Patent No.: US 7,378,316 B2
(45) Date of Patent: May 27, 2008

(54) METHOD FOR FABRICATING SEMICONDUCTOR VERTICAL NROM MEMORY CELLS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/693,105

(22) Filed: Mar. 29, 2007

(65) Prior Publication Data

US 2007/0166927 A1 Jul. 19, 2007

Related U.S. Application Data

(62) Division of application No. 11/211,207, filed on Aug. 25, 2005, now Pat. No. 7,276,413, which is a division of application No. 10/714,753, filed on Nov. 17, 2003, now Pat. No. 7,202,523.

(51) Int. Cl.
*H01L 21/336* (2006.01)

(52) U.S. Cl. .................................... 438/257

(58) Field of Classification Search .............. 438/257
See application file for complete search history.

(56) References Cited

U.S. PATENT DOCUMENTS

| 4,184,207 A | 1/1980 | McElroy |
| 4,420,504 A | 12/1983 | Cooper |
| 4,755,864 A | 7/1988 | Ariizumi |
| 4,881,114 A | 11/1989 | Mohsen |
| 5,241,496 A | 8/1993 | Lowrey |
| 5,330,930 A | 7/1994 | Chi |
| 5,378,647 A | 1/1995 | Hong |
| 5,379,253 A | 1/1995 | Bergemont |
| 5,397,725 A | 3/1995 | Wolstenholme |
| 5,467,305 A | 11/1995 | Bertin |
| 5,576,236 A | 11/1996 | Chang |

(Continued)

FOREIGN PATENT DOCUMENTS

EP 84303740.9 1/1985

(Continued)

OTHER PUBLICATIONS

B. Eitan et al., "Characterization of Channel Hot Electron Injection by the Subthreshold Slope of NROM™ Device," IEEE Electron Device Lett., vol. 22, No. 11, (Nov. 2001) pp. 556-558, Copyright 2001 IEEE.

(Continued)

*Primary Examiner*—Thao P. Le
(74) *Attorney, Agent, or Firm*—Leffert Jay & Polglaze, P.A.

(57) ABSTRACT

An NROM flash memory cell is implemented in an ultra-thin silicon-on-insulator structure. In a planar device, the channel between the source/drain areas is normally fully depleted. An oxide layer provides an insulation layer between the source/drain areas and the gate insulator layer on top. A control gate is formed on top of the gate insulator layer. In a vertical device, an oxide pillar extends from the substrate with a source/drain area on either side of the pillar side. Epitaxial regrowth is used to form ultra-thin silicon body regions along the sidewalls of the oxide pillar. Second source/drain areas are formed on top of this structure. The gate insulator and control gate are formed on top.

21 Claims, 8 Drawing Sheets

U.S. PATENT DOCUMENTS

| | | |
|---|---|---|
| 5,768,192 A | 6/1998 | Eitan |
| 5,792,697 A | 8/1998 | Wen |
| 5,811,852 A | 9/1998 | Ling |
| 5,858,841 A | 1/1999 | Hsu |
| 5,911,106 A | 6/1999 | Tasaka |
| 5,946,558 A | 8/1999 | Hsu |
| 5,966,603 A | 10/1999 | Eitan |
| 5,973,358 A | 10/1999 | Kishi |
| 5,994,745 A | 11/1999 | Hong |
| 6,011,725 A | 1/2000 | Eitan |
| 6,028,342 A | 2/2000 | Chang |
| 6,030,871 A | 2/2000 | Eitan |
| 6,044,022 A | 3/2000 | Nachumovsky |
| 6,081,456 A | 6/2000 | Dadashev |
| 6,108,240 A | 8/2000 | Lavi |
| 6,133,102 A | 10/2000 | Wu |
| 6,134,156 A | 10/2000 | Eitan |
| 6,147,904 A | 11/2000 | Liron |
| 6,157,570 A | 12/2000 | Nachumovsky |
| 6,172,396 B1 | 1/2001 | Chang |
| 6,174,758 B1 | 1/2001 | Nachumovsky |
| 6,175,523 B1 | 1/2001 | Yang |
| 6,180,461 B1 | 1/2001 | Ogura |
| 6,181,597 B1 | 1/2001 | Nachumovsky |
| 6,184,089 B1 | 2/2001 | Chang |
| 6,201,282 B1 | 3/2001 | Eitan |
| 6,201,737 B1 | 3/2001 | Hollmer |
| 6,204,529 B1 | 3/2001 | Lung |
| 6,207,504 B1 | 3/2001 | Hsieh |
| 6,208,557 B1 | 3/2001 | Bergemont |
| 6,215,702 B1 | 4/2001 | Derhacobian |
| 6,218,695 B1 | 4/2001 | Nachumovsky |
| 6,222,768 B1 | 4/2001 | Hollmer |
| 6,240,020 B1 | 5/2001 | Yang |
| 6,243,300 B1 | 6/2001 | Sunkavalli |
| 6,251,731 B1 | 6/2001 | Wu |
| 6,255,166 B1 | 7/2001 | Ogura |
| 6,256,231 B1 | 7/2001 | Lavi |
| 6,266,281 B1 | 7/2001 | Derhacobian |
| 6,269,023 B1 | 7/2001 | Derhacobian |
| 6,272,043 B1 | 8/2001 | Hollmer |
| 6,275,414 B1 | 8/2001 | Randolph |
| 6,282,118 B1 | 8/2001 | Lung |
| 6,291,854 B1 | 9/2001 | Peng |
| 6,297,096 B1 | 10/2001 | Boaz |
| 6,303,436 B1 | 10/2001 | Sung |
| 6,327,174 B1 | 12/2001 | Jung |
| 6,348,711 B1 | 2/2002 | Eitan |
| 6,392,930 B2 | 5/2002 | Jung |
| 6,417,053 B1 | 7/2002 | Kuo |
| 6,421,275 B1 | 7/2002 | Chen |
| 6,424,001 B1 | 7/2002 | Forbes et al. |
| 6,429,063 B1 | 8/2002 | Eitan |
| 6,432,778 B1 | 8/2002 | Lai |
| 6,461,949 B1 | 10/2002 | Chang |
| 6,468,864 B1 | 10/2002 | Sung |
| 6,469,342 B1 | 10/2002 | Kuo |
| 6,477,084 B1 | 11/2002 | Eitan |
| 6,486,028 B1 | 11/2002 | Chang |
| 6,487,050 B1 | 11/2002 | Liu |
| 6,496,034 B2 | 12/2002 | Forbes et al. |
| 6,498,377 B1 | 12/2002 | Lin |
| 6,514,831 B1 | 2/2003 | Liu |
| 6,531,887 B2 | 3/2003 | Sun |
| 6,545,309 B1 | 4/2003 | Kuo |
| 6,548,425 B2 | 4/2003 | Chang |
| 6,552,387 B1 | 4/2003 | Eitan |
| 6,559,013 B1 | 5/2003 | Pan |
| 6,576,511 B2 | 6/2003 | Pan |
| 6,580,116 B2 | 6/2003 | Ogura |
| 6,580,135 B2 | 6/2003 | Chen |
| 6,580,630 B1 | 6/2003 | Liu |
| 6,602,805 B2 | 8/2003 | Chang |
| 6,607,957 B1 | 8/2003 | Fan |
| 6,610,586 B1 | 8/2003 | Liu |
| 6,613,632 B2 | 9/2003 | Liu |
| 6,617,204 B2 | 9/2003 | Sung |
| 6,657,252 B2 | 12/2003 | Fried |
| 6,664,143 B2 | 12/2003 | Zhang |
| 6,794,712 B1 | 9/2004 | Fujiwara |
| 6,830,963 B1 | 12/2004 | Forbes |
| 6,906,390 B2 | 6/2005 | Nomoto et al. |
| 6,943,402 B2 | 9/2005 | Nagasaka et al. |
| 6,949,788 B2 | 9/2005 | Fujiwara et al. |
| 7,138,681 B2 | 11/2006 | Forbes et al. |
| 2001/0001075 A1 | 5/2001 | Ngo |
| 2001/0004332 A1 | 6/2001 | Eitan |
| 2001/0011755 A1 | 8/2001 | Tasaka |
| 2002/0043682 A1 | 4/2002 | Yamazaki |
| 2002/0142569 A1 | 10/2002 | Chang |
| 2002/0146885 A1 | 10/2002 | Chen |
| 2002/0151138 A1 | 10/2002 | Liu |
| 2002/0168875 A1 | 11/2002 | Chang |
| 2002/0177275 A1 | 11/2002 | Liu |
| 2002/0182829 A1 | 12/2002 | Chen |
| 2003/0040152 A1 | 2/2003 | Liu |
| 2003/0057997 A1 | 3/2003 | Sun |
| 2003/0067807 A1 | 4/2003 | Lin |
| 2003/0117861 A1 | 6/2003 | Maayan |
| 2003/0183873 A1 | 10/2003 | Fujiwara |
| 2003/0222294 A1 | 12/2003 | Yoshino |

FOREIGN PATENT DOCUMENTS

| | | |
|---|---|---|
| EP | 90115805.5 | 2/1991 |
| EP | 01113179.4 | 12/2002 |
| WO | 03/017374 A2 | 2/2003 |

OTHER PUBLICATIONS

B. Eitan et al., "Spatial Characterization of Hot Carriers Injected into the Gate Dielectric Stack of a MOFSET Based on Non-Volatile Memory Device," date unknown, pp. 58-60. date unknown.

B. Eitan et al., "NROM: A Novel Localized Trapping, 2-Bit Non-volatile Memory Cell," IEEE Electron Device Lett, vol. 21, No. 11, (Nov. 2000), pp. 543-545, Copyright 2000 IEEE.

E. Maayan et al., "A 512Mb NROM Flash Data Storage Memory With 8MB/s Data Range," Dig. IEEE Int. Solid-State Circuits Conf., San Francisco, (Feb 2002), pp. 1-8, Copyright Saifun Semiconductors Ltd. 2002.

E. Maayan et al., "A 512Mb NROM Flash Data Storage Memory with 8MB/s Data Range," ISSCC 2002 Visuals Supplement , Session 6, SRAM and Non-Volatile Memories, 6.1 and 6.2, pp. 76-77, 407-408. Copyright 1990 IEEE.

M. Janai, "Data Retention, Endurance and Acceleration Factors of NROM Devices," IEEE 41$^{st}$ Annual International Reliability Physics Symposium, Dallas, TX (2003), pp. 502-505, Copyright 1989 IEEE.

S. Minami and Y. Kamigaki,"A Novel MONOS Nonvolatile Memory Device Ensuring 10-Year Data Retention after $10^7$ Erase/Write Cycles," IEEE Transactions on Electron Devices, vol. 40, No. 11 (Nov. 1993) pp. 2011 2017, Copyright 1998 IEEE.

C. Pan, K. Wu, P. Freiberger, A. Chatterjee, G. Sery, "A Scaling Methodology for Oxide-Nitride-Oxide Interpoly Dielectric for EPROM Applications," IEEE Transactions on Electron Devices, vol. 37, No. 6, (Jun. 1990) pp. 1439-1443, Copyright 1990 IEEE.

P. Manos and C. Hart, "A Self-Aligned EPROM Structure with Superior Data Retention," IEEE Electron Device Letters, vol. 11, No. 7, (Jul. 1990) pp. 309-311, Copyright 1990 IEEE.

W. Owen and W. Tchon, "E$^2$PROM Product Issues and Technology Trends," IEEE 1989, pp. 17-19, Copyright 1989 IEEE.

T. Huang, F. Jong, T. Chao, H. Lin, L. Leu, K. Young, C. Lin, K. Chiu, "Improving Radiation Hardness of EEPROM/Flash Cell BY $N_2O$ Annealing,"IEEE Electron Device Letters, Vol. 19, No. 7 (Jul. 1998), pp. 256-258, Copyright 1998 IEEE.

B. Eitan et al., "Electrons Retention Model for Localized Charge in Oxide-Nitride-Oxide (ONO) Dielectric," IEEE Device Lett., vol. 23, No. 9, (Sep. 2002), pp. 556-558. Copyright 2002 IEEE.

T. Nozaki, T. Tanaka, Y. Kijiya, E. Kinoshita, T. Tsuchiya, Y. Hayashi, "A 1-Mb EEPROM with MONOS Memory Cell for Semiconductor Disk Application," IEEE Journal of Solid-State Circuits, vol. 26, No. 4 (Apr. 1991), pp. 497-501, Copyright 1991 IEEE.

F. Vollebregt, R. Cuppens, F. Druyts, G. Lemmen, F. Verberne, J. Solo,"A New E(E)PROM Technology With A $TiSi_2$ Control Gate," IEEE 1989, pp. 25.8.1-25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939-1946, Copyright 2002 IEEE.

B. Eitan et al. "Spatial characterization of Channel hot electron injection utilizing subthreshold slope of the localized charge storage NROM™ memory device," Non-Volatile Semiconductor Memory Workshop (NVSMW), Monterey, CA, (Aug. 2001), pp. 1-2.

B. Eitan et al., "Can NROM, a 2-bit, Trapping Storage NVM Cell, Give a Real Challenge to Floating Gate Cells?" Int. Conf. on Solid State Devices and Materials, Tokyo, (1999), pp. 1-3, Copyright 1999 Saifun Semiconductors Ltd.

S. Ogura, et al., "Twin MONOS Cell with Dual Control Gates," Halo LSI and New Halo, pp. 187-187.3, date unknown.

T. Sugizaki, et al. "New 2-bit/Tr MONOS Type Flash Memory using $Al_2O_3$ as Charge Trapping Layer," Fujitsu Laboratories Ltd, date unknown.

T. Saito, et al. "Hot Hole Erase Characteristics and Reliability in Twin MONOS Device" Halo LSI, date unknown.

Saifun Semiconductors, LTD. PowerPoint Presentation, date unknown.

Y. Roizin, et al. "Novel Techniques for data retention and Leff measurements in two bit *MicroFlash*® Memory Cells," Characterization and Metrology for ULSI Technology: 200 International Conf., pp. 181-185, Copyright 2001 American Institute of Physics, 1-56396-967-X/01.

W. J. Tsai, et al. "Cause of Data Retention Loss in a Nitride-Based Localized Trapping Storage Flash Memory Cell," IEEE 40th Annual International Reliability Physics Symposium, Dallas, (2002), pp. 34-38. Copyright 2002 IEEE.

W.J. Tsai, et al. "Data Retention Behavior of a SONOS Type Two-Bit Storage Flash Memory Cell," IEDM 01-0179-01-722, Copyright 2001 IEEE.

A. Shappir, et al., "Subtreshold slope degradation model for localized-charge-trapping based non-volatile memory devices," Solid-State Electronics 47 (2003), pp. 937-941. Copyright 2003 Elsevier Science Ltd.

R. Neale, "AMD's MirrorBit—a big step in Flash progress," Electronic Engineering Design, V. 74, No. 906, pp. 47-50. date unknown.

I. Bloom., et al. "NROM™-a new technology for non-volatile memory products" Solid-State Electronics 46 (2002), pp. 1757-1763. Copyright 2002 Elsevier Science Ltd.

J. Bu and M. White, "Electrical characterization on ONO triple dielectric in SONOS nonvolatile memory devices," Solid-State Electronics 45 (2001) pp. 47-51. Copyright 2001 Elsevier Science Ltd.

Y. Kamigaki and S. Minami, "MNOS Nonvolatile Semiconductor Memory Technology: Present and Future," IEICE Trans. Electron, vol. E84-C, No. 6, pp. 713-723 (Jun. 2001).

E. Lusky, et al., "Electron Discharge Model of Locally-Trapped Charge in Oxide-Nitride-Oxide (ONO) Gates for NROM™ Non-Volatile Semiconductor Memory Devices," Extended Abstracts of the 2001 International Conference on Solid State Devices and Materials, Tokyo, 2001 pp. 534-535.

A. Nughin, "n-Channel 256kb and 1Mb and 1Mb EEPROMs," ISSCC91, Session 134, Special Session on Technology in the USSR, Paper 13.4, 1991 IEEE InternationalSolid State Circuits Conference, Digest of Technical Papers, pp. 228-229, 319.

G. Xue, et al., "Low Voltage Low Cost Nitride Embedded Flash Memory Cell" IMEC., date unknown.

L. Breuil, et al., "A new 2 isolated-bits/cell flash memory device with self aligned split gate structure using ONO stacks for charge storage," IMEC, date unknown.

J. Willer, et al., "UMEM: A U-shape Non-Volatile-Memory Cell," Ingentix GmbH &Co. KG., Infineon Technologies and Saifun Semiconductors, date unknown.

S. Kang, et al., "A Study of SONOS Nonvolatile Memory Cell Controlled Structurally by Localizing Charge-Trapping Layer," Samsung Electrons Co., Ltd, date unknown.

Y. Roizin, et al., "In-Process Charging in *microFLASH*® Memory Cells," Tower Semiconductor, Ltd., date unknown.

A. Shappir, et al., "Subthreshold slope degradation model for localized-charge-trapping based non-volatile memory devices," Solid State Electronics, 47 (2003) pp. 937-941, Copyright 2003 Elsevier Science Ltd.

I. Fujiwara, et al., "High speed program/erase sub 100 nm MONOS memory cell," Sony Corporation, Date Unknown.

E. Lusky, et al., "Investigation of Spatial Distinution of CHE Injection Utilizing the Subthreshold Slope and the Gate Induced Drain Leakage (GIDL) Characteristics of the NROM™ Device," Saifum Semiconductors, Ltd. and Tel Aviv University, Dept of Physical Electronics, pp. 1-2, date unknown.

C. C. Yeh, et al., "A Modified Read Scheme to Improve Read Disturb and Second Bit Effect in a Sealed MXVAND Flash Memory Cell," Macronix International Co., Ltd. and Department of Electronics Engineering, National Chiao-Tung University, date unknown.

Y. K. Lee, et al., "30-nm Twin Silicon-Oxide-Nitride-Oxide-Silicon (SONOS) Memory (TSM) with High Erase Speed and Reliability," School of Electrical Engineering, Seoul National University, C&M, System LSI, ATD, PD, Samsung Electronics Co., date unknown.

J. H. Kim, et al., "Highly Manufacturable SONOS Non-Volatile Memory for the Embedded SoC Solution," 2003 Symposium on VLSI Technology Digest of Technical Papers, pp. 31-32.

Y. Hayashi, et al., "Twin MONOS Cell with Dual Control Gates," 2000 Symposium on VLSI Technology Digest of Technical Papers, 2000 IEEE, pp. 122-123.

M. K. Cho and D.M. Kim, "High Performance SONOS Memory Cells Free of Drain Turn-On and Over-Erase: Compatibility Issue with Current Flash Technology," IEEE Electron Device Letters, vol. 21, No. 8, Aug. 2000, pp. 399-401, Copyright 2000 IEEE.

T. Y. Chan, K.K. Young and C. Hu, "A True Single-Transistor Oxide-Nitride-Oxide EEPROM Device," IEEE Electron Device Letters, vol. EDL-8, No. 3, Mar. 1987, pp. 93-95., Copyright 1987 IEEE.

I. Bloom, et al., "NROM™ NVM technology for Multi-Media Applications," Saifun Semiconductors, Ltd. Ingentix, Ltd. and Infincon Technologies, date unknown.

E. J. Prinz, et al., "An Embedded 90nm SONOS Flash EEPROM Utilizing Hot Electron Injection Programming and 2-Sided Hot Hole Injection Erase," Motorola Embedded Memory Center, date unknown.

Y. Roizin, et al., "Retention Characteristics of *Micro*Flash® Memory (Activation Energy of Traps in the ONO Stack)," Tower Semiconductor, Ltd., date unknown.

Y. Roizin, et al., "Activation Energy of Traps in the ONO Stack of *micro*Flash® Memory Cells," Tower Semiconductor, Ltd., date unknown.

Y. Roizin, et al., "Dummy' Gox Optimization of *micro*Flash® Technology," Tower Semiconductor, Ltd., date unknown.

Y. K. Lee, et al., "Multi-Level Vertical Channel SONOS Nonvolatile Memory on SOI," 2002 Symposium on VLSI Technology Digest of Technical Papers, Copyright 2002 IEEE.

T. Saito, et al., "CHE Program Behavior in MONOS Device," Halo LSI., date unknown.

J. Bu, et al., "Retention Reliability Enhanced SONOS NVSM with Scaled Programming Voltage," Microelectronics Lab., date unknown.

H. Tomiye, et al., "A novel 2-bit/cell MONOS memory device with a wrapped-control-gate structure that applies source-side hot-electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147-148.

US 7,378,316 B2

METHOD FOR FABRICATING SEMICONDUCTOR VERTICAL NROM MEMORY CELLS

RELATED APPLICATION

This Application is a Divisional of application Ser. No. 11/211,207, U.S. Pat. No. 7,276,413 titled "NROM FLASH MEMORY DEVICES ON ULTRATHIN SILICON", filed Aug. 25, 2005, which is a Divisional of application Ser. No. 10/714,753, now U.S. Pat. No. 7,202,523, filed Nov. 17, 2003, that are commonly assigned and incorporated herein by reference.

TECHNICAL FIELD OF THE INVENTION

The present invention relates generally to memory devices and in particular the present invention relates to nitride read only memory flash memory devices.

BACKGROUND OF THE INVENTION

The increased speed and capability of computers and other electronic devices requires better performance from the integrated circuits that make up a device. One way to make the integrated circuits faster is to reduce the size of the transistors that make up the device. However, as transistors are made smaller and faster, delays through the connections between the transistors becomes greater in relation to the speed of the transistor.

An alternative technique to speed up integrated circuits is to use alternative semiconductors. For example, silicon-on-insulator (SOI) technology provides a 25-35% performance increase over equivalent CMOS technologies. SOI refers to placing a thin layer of silicon on top of an insulator such as silicon oxide or glass. The transistors would then be built on this thin layer of SOI. The SOI layer reduces the capacitance of the transistors so that they operate faster.

FIG. 1 illustrates a typical prior art SOI semiconductor. The transistor is formed in the silicon layer 101 that is over the insulator 102. The insulator is formed on top of the substrate 103. Within the silicon layer 101, the drain/source regions 105 and 106 are formed. The gate 107 is formed above the partially depleted channel 109. A floating body 110 is within the depleted region 112 and results from the partial depletion.

SOI technology, however, imposes significant technical challenges. The silicon film used for SOI transistors must be perfect crystalline silicon. The insulator layer, however, is not crystalline. It is very difficult to make perfect crystalline silicon-on-oxide or silicon with other insulators since the insulator layer's crystalline properties are so different from the pure silicon. If perfect crystalline silicon is not obtained, defects will find their way onto the SOI film. This degrades the transistor performance.

Additionally, floating body effects in partially depleted CMOS devices using SOI technology are undesirable in many logic and memory applications. The floating bodies cause threshold voltages and switching speeds to be variable and complex functions of the switching history of a particular logic gate. In dynamic logic and DRAM memories, the floating bodies cause excess charge leakage and short retention times that can cause data loss. In conventional flash memories and NROM devices, the floating bodies cause reduced erase fields and slower erase times.

For the reasons stated above, and for other reasons stated below which will become apparent to those skilled in the art upon reading and understanding the present specification, there is a need in the art for a way to eliminate floating body effects in CMOS devices incorporating SOI technology.

DETAILED DESCRIPTION

Figure 1:
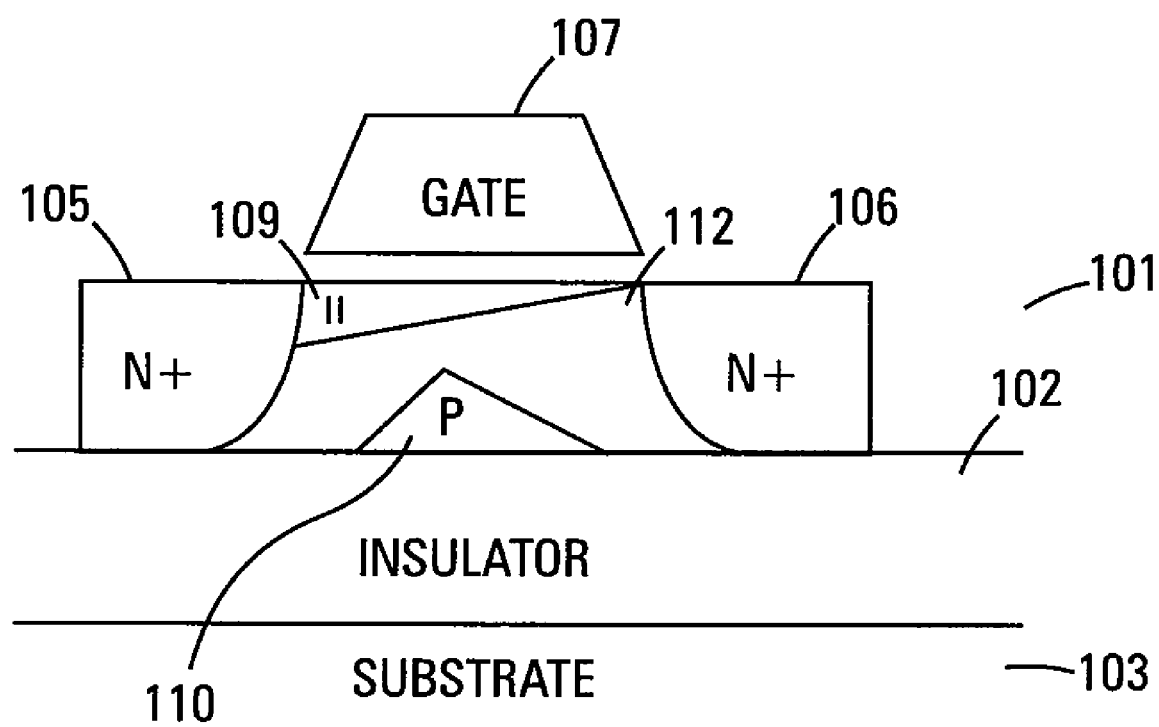
FIG. 1 shows a cross-sectional view of a typical prior art SOI semiconductor.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
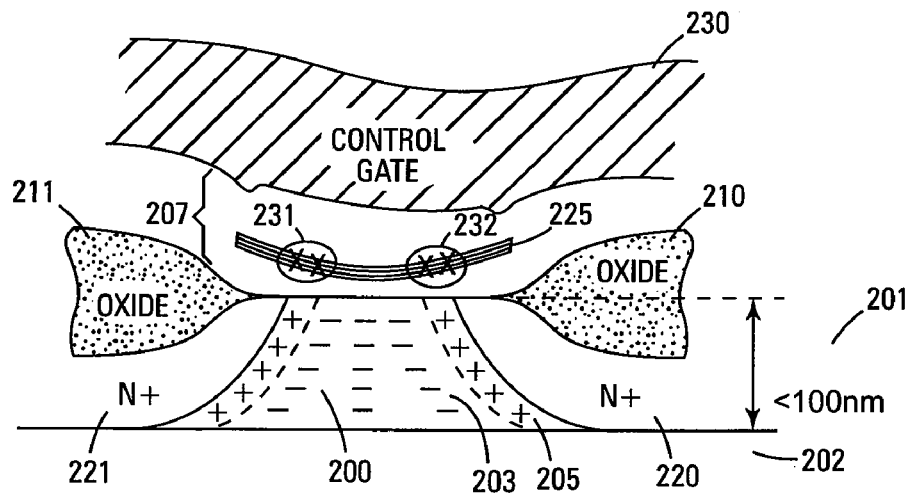
FIG. 2 shows a cross-sectional view of one embodiment for a planar NOR NROM cell using ultra-thin SOI.

FIG. 2 illustrates a cross-sectional view of one embodiment of a planar NROM cell using ultra-thin silicon-on-insulator (SOI) technology. The NROM flash memory cell of FIG. 2 is a NOR array cell with virtual ground bit lines.

The NROM flash memory cell is comprised of the silicon layer 201 on the insulator 202. The silicon 201 in an ultra-thin SOI cell is less than 100 nm (1000 Å). This layer 201 is comprised of two source/drain areas 220 and 221 that act as bit lines 220 and 221. In one embodiment, these areas 220 and 221 are n-type material. Alternate embodiments use p-type material if the substrate is an n-type material.

The body region 200 between the bit lines 220 and 221 is normally fully depleted in ultra-thin SOI. The body region 200 is comprised of ionized acceptor impurities 203 and ionized donor impurities 205. Two oxide areas 210 and 211 are deposited on the silicon 201.

A gate insulator 207, in one embodiment, is a composite structure of oxide-nitride-oxide (ONO) formed between the control gate 230 and the silicon layer 201. The control gate 230, in one embodiment, is a polysilicon material and extends in the 'x' direction in the NOR flash cell embodiment. The nitride layer 225 has two charge storage areas 231 and 232.

Alternate embodiments of the present invention use other gate insulators besides the ONO composite structure shown. These structures may include oxide-nitride-aluminum oxide composite layers, oxide-aluminum oxide-oxide composite layers, oxide, silicon oxycarbide-oxide composite layers as well as other composite layers.

In still other alternate embodiments, the gate insulator may include thicker than normal silicon oxides formed by wet oxidation and not annealed, silicon rich oxides with inclusions of nanoparticles of silicon, silicon oxynitride layer that are not composite layers, silicon rich aluminum oxide insulators that are not composite layers, silicon oxycarbide insulators that are not composite layers, silicon oxide insulators with inclusions of nanoparticles of silicon carbide, in addition to other non-stoichiometric single layers of gate insulators of two or more commonly used insulator materials such as Si, N, Al, Ti, Ta, Hf, Zr, and La.

Figure 3:
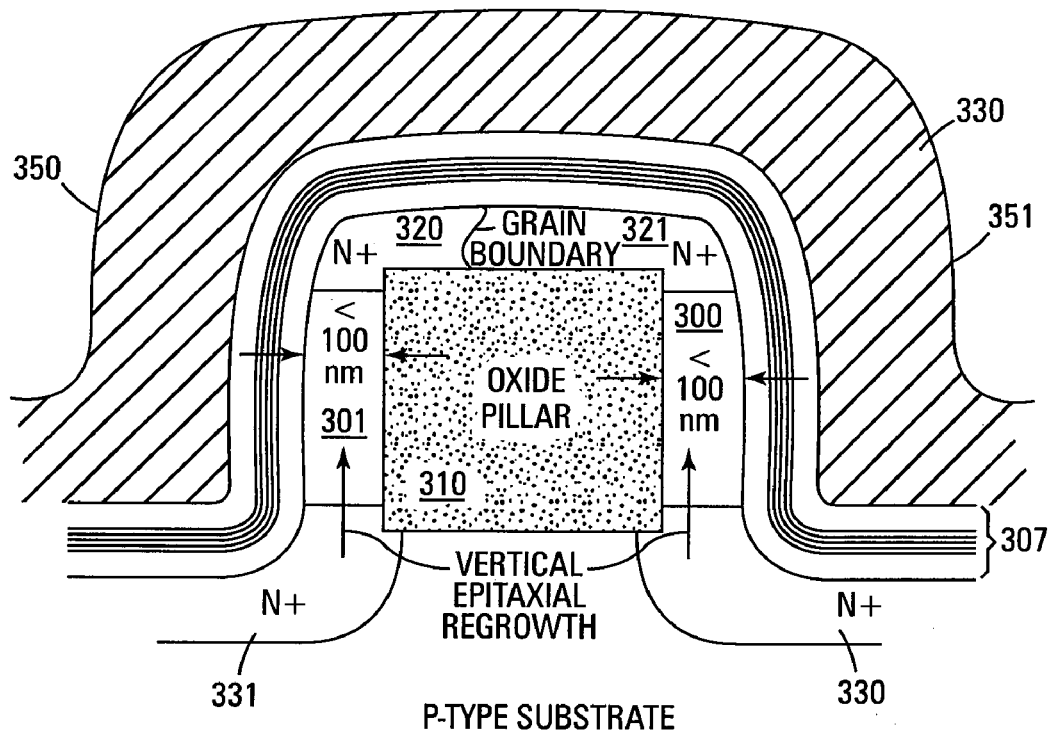
FIG. 3 shows a cross-sectional view of one embodiment of two vertical NOR NROM cells of the present invention using ultra-thin SOI.

FIG. 3 illustrates a cross-sectional view of one embodiment of two vertical NOR NROM cells 350 and 351 of the present invention using ultra-thin SOI. The vertical embodiment provides for higher density memory arrays.

The cells 350 and 351 of FIG. 3 each have source/drain areas 330 and 331 that operate as bit lines and are comprised of n+ doped silicon. Alternate embodiments use p-type material if the substrate is comprised of n-type material. Additional source/drain areas 320 and 321 for each transistor are formed at the top of a vertical oxide pillar 310. The left transistor 350 uses source/drain areas 320 and 331 while the right transistor uses source/drain areas 321 and 330. The upper source/drain areas 320 and 321 are separated by a grain boundary but are electrically coupled. The vertical oxide pillar 310 is an insulator between the two transistors 350 and 351.

Vertical epitaxial regrowth of amorphous layers is used to provide crystalline layers of ultra-thin silicon 300 and 301 along the sidewalls of the vertical oxide pillar 310. These layers are the ultra-thin silicon (i.e., <100 nm) body regions 300 and 301 and are normally fully depleted. The direction of thickness of the silicon body region 300 and 301 is illustrated in each region. The left ultra-thin silicon body region is part of the left transistor 350 while the right body region 300 is part of the right transistor 351.

The gate insulator layer 307, in one embodiment, is a composite ONO structure. Alternate embodiments of this layer 307 are disclosed above. The control gate 330 is formed above this insulator layer 307 and is common to both transistors 350 and 351 such that it acts as a word line in a memory array. In one embodiment, the control gate 330 is a polysilicon material.

Figure 4:
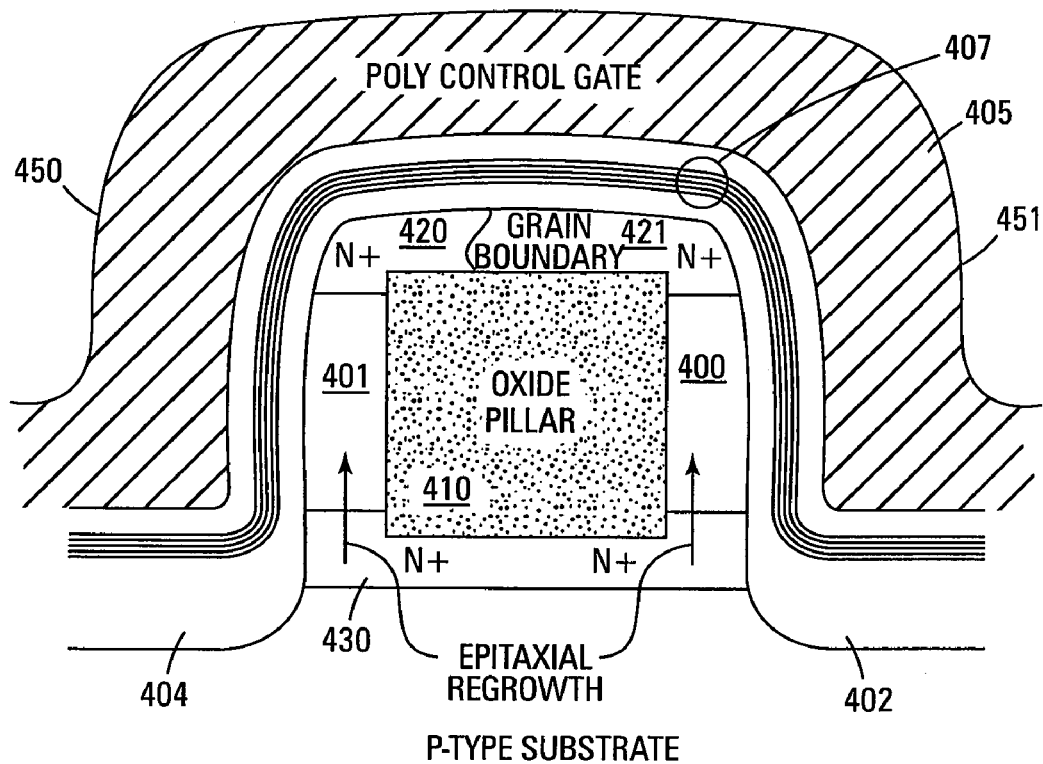
FIG. 4 shows a cross-sectional view of another embodiment of two vertical NOR NROM cells of the present invention using ultra-thin SOI.

FIG. 4 illustrates a cross-sectional view of another embodiment of two vertical NOR NROM cells of the present invention using ultra-thin SOI. This embodiment has an architecture that is substantially similar to the embodiment of FIG. 3 in that the ultra-thin silicon body regions 400 and 401 are formed by epitaxial regrowth along the sidewalls of the oxide pillar 410. The top source/drain areas 420 and 421 are formed at the top of the oxide pillar 410 and the common poly control gate 405 is formed over the gate insulator 407 coupling both transistors 450 and 451 by a word line.

However, in the embodiment of FIG. 4, the bottom oxide layer 402 and 404 of the gate insulator 407 is thicker in the trench than in the previous embodiment. Additionally, the two source/drain areas of FIG. 3 are replaced by a single n+ source/drain region 430 that is isolated between the portions of the thicker oxide layer.

Figure 5:
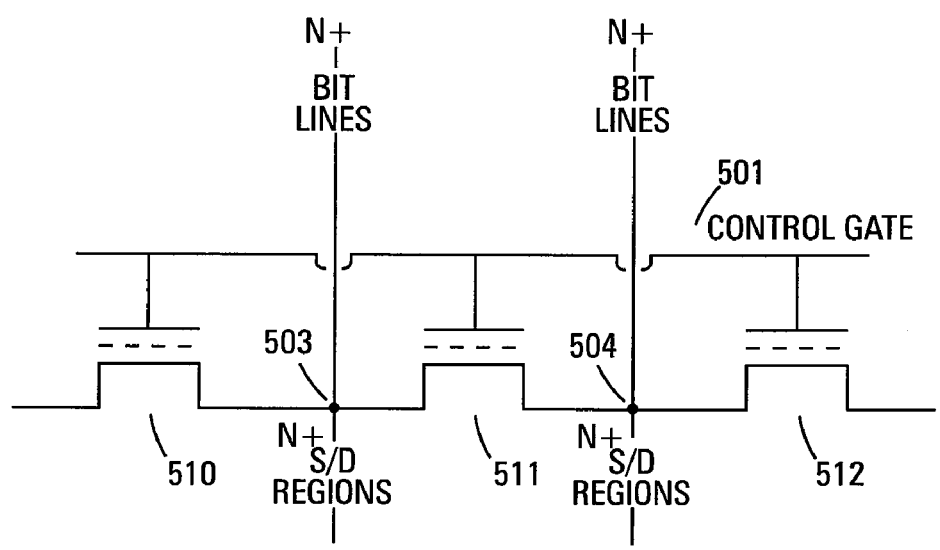
FIG. 5 shows an electrical equivalent circuit of a NOR NROM flash memory array of the present invention.

FIG. 5 illustrates an electrical equivalent circuit of a NOR NROM flash memory array of the present invention. This circuit can represent the planar embodiments of the present invention as well as the vertical embodiment of FIG. 3.

The control gate 501 crosses all of the devices 510-512 in the array. The n+ source/drain regions 503 and 504 are used as virtual ground data or bit lines. As is well known in the art, the bit lines of the array are coupled to a sense amplifier in order to read data from the cells 510-512. The control gate 501 is the word line used to select the cells 510-512.

Figure 6:
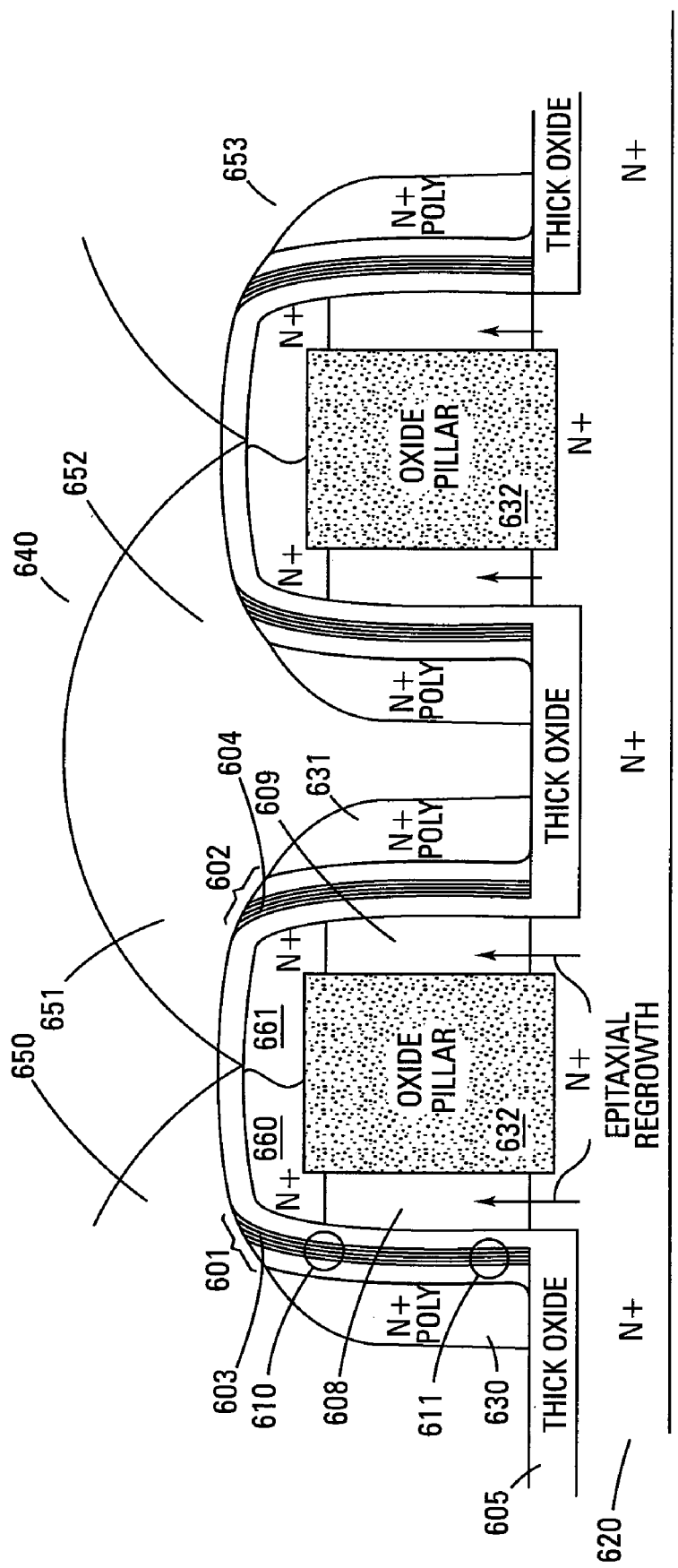
FIG. 6 shows a cross-sectional view of yet another alternate embodiment of a vertical NOR NROM memory array of the present invention using ultra-thin SOI.

FIG. 6 illustrates a cross-sectional view of yet another alternate embodiment of a vertical NOR NROM memory array of the present invention using ultra-thin SOI. This figure illustrates four vertical transistors 650-653. For purposes of clarity, only the transistors formed around the first oxide pillar 632 are described. The remaining transistors are substantially identical in structure and operation.

As in previous embodiments, the two ultra-thin silicon body regions 608 and 609 are formed by epitaxial regrowth along the sidewalls of the oxide pillar 632. The gate insulator layers 601 and 602 are formed alongside of the silicon body regions 608 and 609. The n+ polysilicon gate structures 630 and 631 for each transistor 650 and 651 are then formed on the insulator layers 601 and 602.

The nitride layers 603 and 604 provide two charge storage areas 610 and 611 for each transistor 650-653. In the trench area, the lower oxide layer 605 has a thicker composition than the rest of the gate insulator layer. The above cells 650-653 are formed on a lower n+ region 620 on the substrate that acts as a common source/drain area, depending on the direction that each transistor is biased.

The upper n+ regions 660 and 661 are the second common source/drain area for each transistor 650 and 651. The upper n+ region 660 and 661 of each transistor is coupled to other transistors in the array by a bonding wire 640 or other conductive device.

Figure 7:
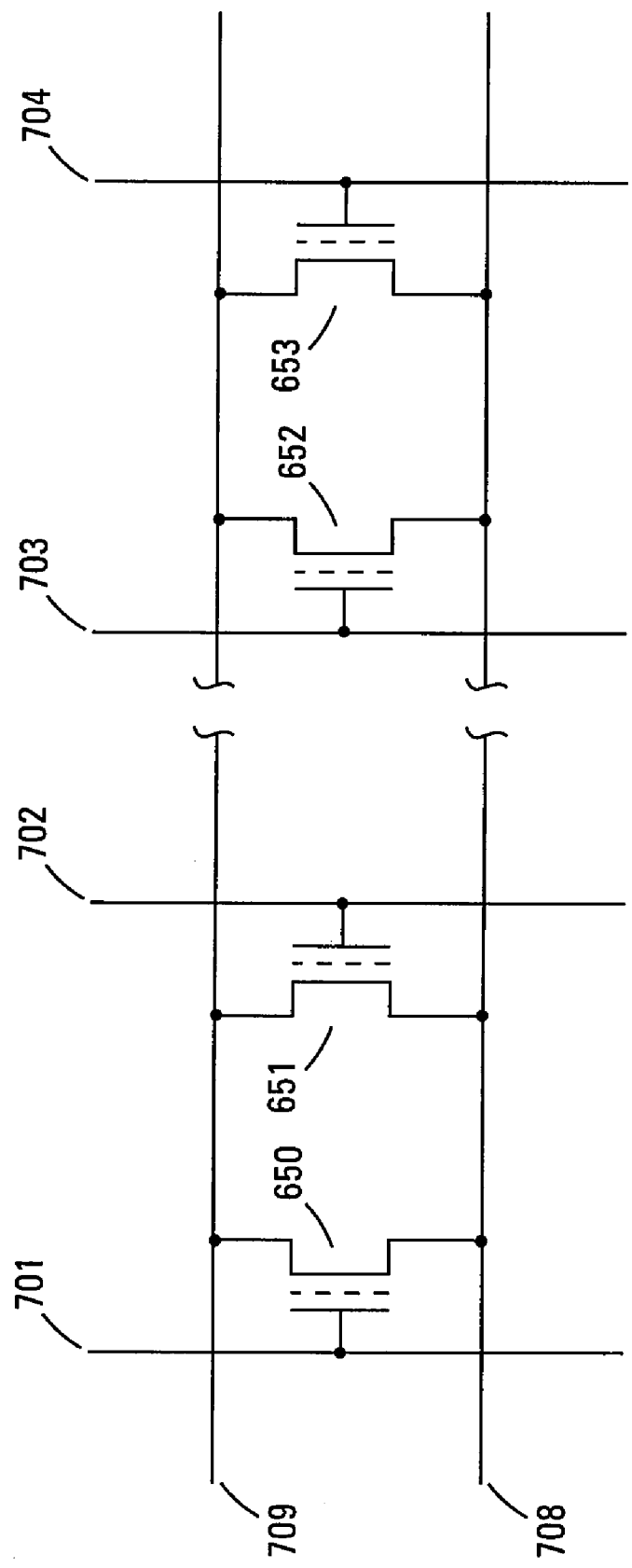
FIG. 7 shows an electrical equivalent circuit of a NOR NROM flash memory array of the present invention in accordance with the embodiment of FIG. 6.

FIG. 7 illustrates an electrical equivalent circuit of a NOR NROM flash memory array of the present invention in accordance with the embodiment of FIG. 6. This figure illustrates the respective cells 650-653 as described in FIG. 6 above.

The control gates 701-704 are coupled to other cells in the array and act as word lines. Two of these control gates 701-704 are illustrated in FIG. 6 as 630 and 631. The top common source/drain areas 660 and 661 are shown as virtual ground or data bit line 709 while the common source/drain area 620 is shown as virtual ground or data bit line 708.

Figure 8:
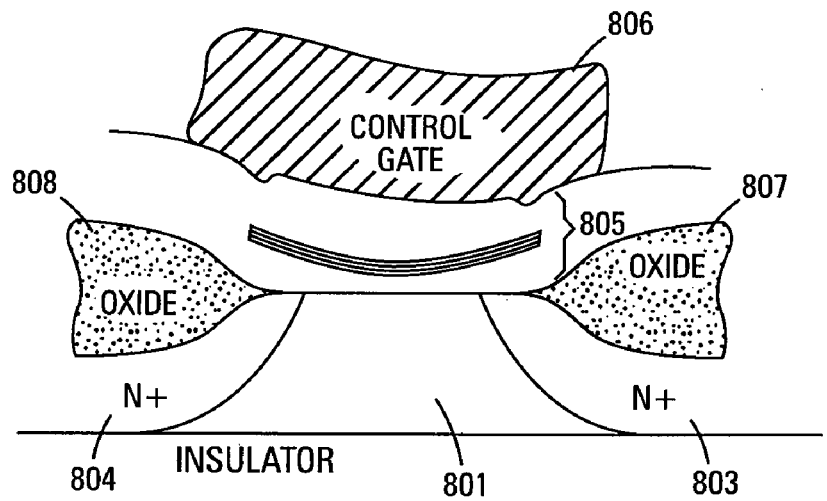
FIG. 8 shows a cross-sectional view of one embodiment of a planar NAND NROM cell of the present invention using ultra-thin SOI.

FIG. 8 illustrates a cross-sectional view of one embodiment of a planar NAND NROM cell of the present invention using ultra-thin SOI. This embodiment is comprised of the two source/drain regions 803 and 804 with the fully depleted body region 801 in the ultra-thin SOI. The two oxide regions 807 and 808 are formed above the n+ areas and the gate insulator 805 is formed over this architecture. In one embodiment, the gate insulator 805 is a composite ONO layer but can be any other type of material including those described above.

The control gate 806 is formed above the gate insulator 805. In the NAND embodiment, the gate 806 extends in the 'z' direction instead of the 'x' direction as in the NOR embodiment.

Figure 9:
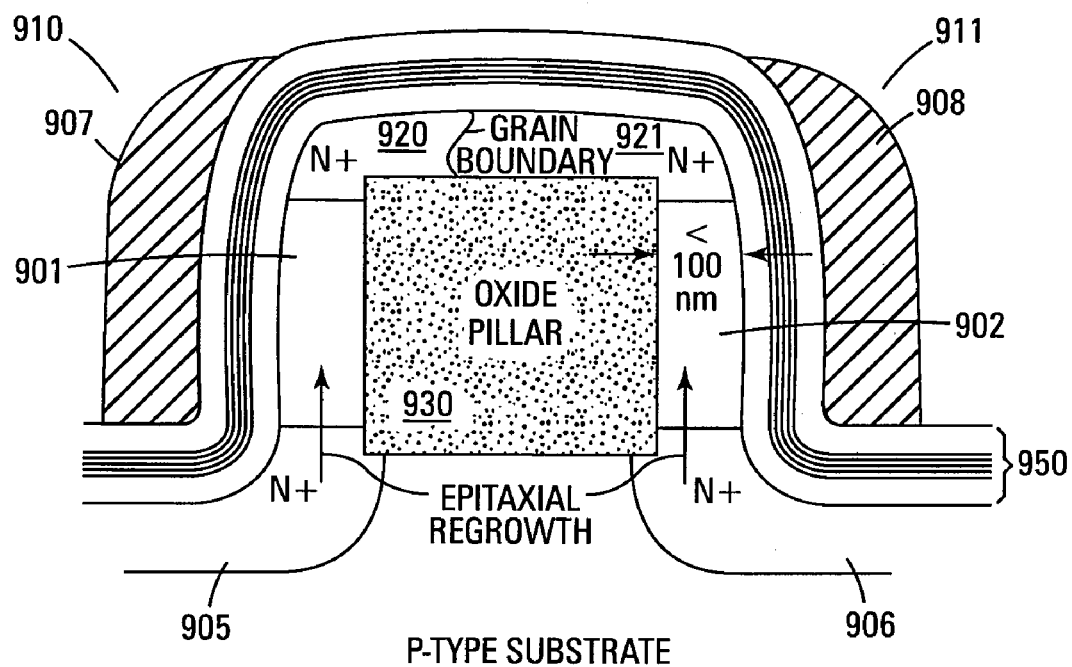
FIG. 9 shows a cross-sectional view of one embodiment of two vertical NAND NROM cells of the present invention using ultra-thin SOI.

FIG. 9 illustrates a cross-sectional view of one embodiment of two vertical NAND NROM cells 910 and 911 of the present invention using ultra-thin SOI. Each transistor 910 and 911 is comprised of a source/drain region 905 and 906 formed in a p-type substrate material. Second source/drain regions 920 and 921 are formed on top of the oxide pillar 930 and separated by the grain boundary while still electrically coupled. The source/drain regions 905, 906, 920, and 921 function as electrical connections down the row.

Epitaxial regrowth is used to grow ultra-thin silicon body regions 901 and 902 on the sidewalls of the oxide pillar 930. As in previous embodiments, these regions 901 and 902 are each less than 100 nm thick.

The gate insulator 950 is formed on top of the transistors 910 and 911. In one embodiment, the gate insulator 950 is an ONO composite layer. Alternate embodiments for the composition of this layer have been illustrated previously.

Control gates 907 and 908 for each transistor 910 and 911 respectively are formed from a polysilicon material on each side of the gate insulator 950. The control gates 907 and 908 are coupled to other transistors to act as word lines.

Figure 10:
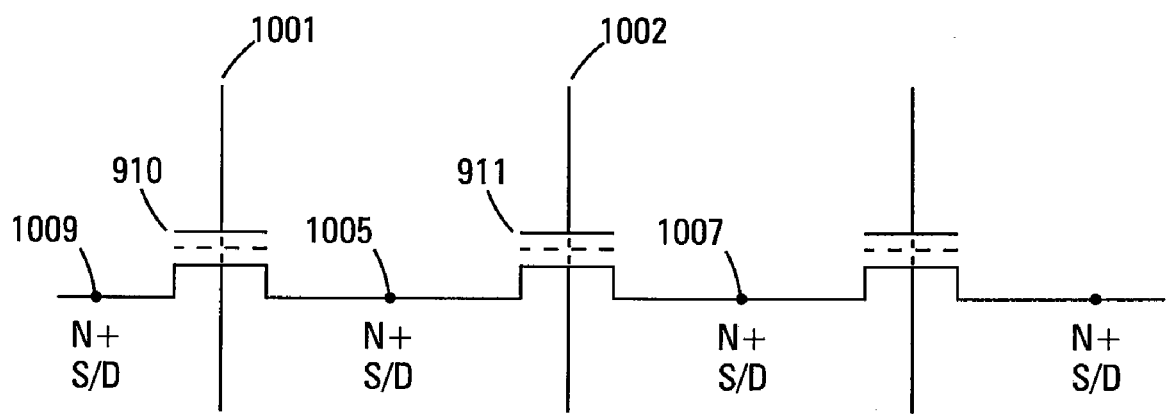
FIG. 10 shows an electrical equivalent circuit of a NAND NROM flash memory array of the present invention in accordance with the embodiment of FIG. 9.

FIG. 10 illustrates an electrical equivalent circuit of a NAND NROM flash memory array of the present invention in accordance with the embodiment of FIG. 9. The two transistors 910 and 911 of FIG. 9 are shown.

The n+ source/drain connection 1005 of FIG. 10 corresponds to the two source/drain regions 920 and 921 of FIG. 9. The word lines 1001 and 1002 of FIG. 10 correspond to the control gate 907 and 908 respectively of FIG. 9. The source/drain regions 905 and 906 formed in the substrate of FIG. 9 correspond to the source/drain connections 1009 and 1007 of FIG. 10.

The above embodiments are illustrated as n-channel type transistors. However, one of ordinary skill in the art will understand that the conductivity types can be reversed by altering the doping types such that the present invention is equally applicable to include structures NROM structures having ultra-thin silicon, p-channel type transistors.

The masking and etching steps used to form the ultra-thin silicon NROM flash memory cells of the present invention are not discussed in detail. The various steps required to form the above-described architectures are well known by those skilled in the art.

Figure 11:
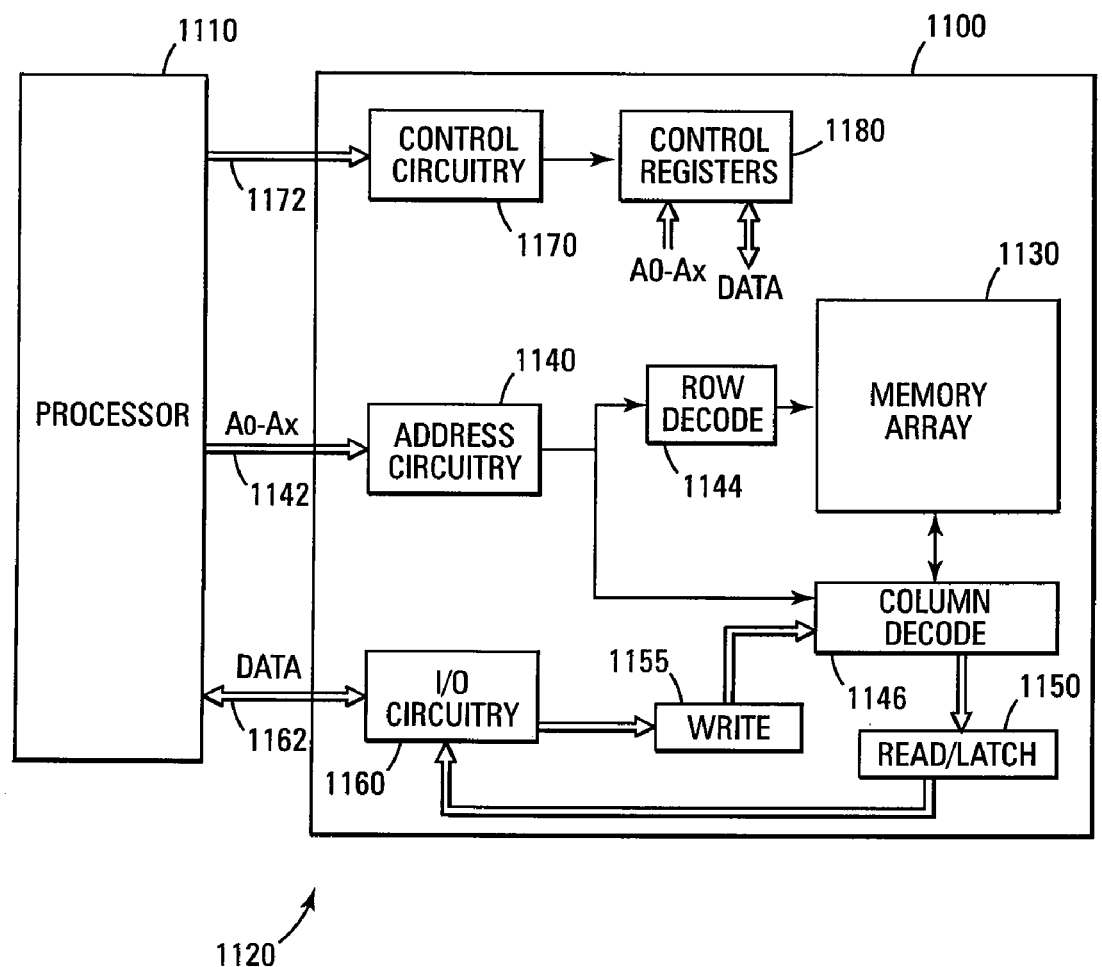
FIG. 11 shows a block diagram of one embodiment of an electronic system of the present invention.

FIG. 11 illustrates a functional block diagram of a memory device 1100 that can incorporate the ultra-thin SOI flash memory cells of the present invention. The memory device 1100 is coupled to a processor 1110. The processor 1110 may be a microprocessor or some other type of controlling circuitry. The memory device 1100 and the processor 1110 form part of an electronic system 1120. The memory device 1100 has been simplified to focus on features of the memory that are helpful in understanding the present invention.

The memory device includes an array of flash memory cells 1130. In one embodiment, the memory cells are NROM flash memory cells and the memory array 1130 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture.

An address buffer circuit 1140 is provided to latch address signals provided on address input connections A0-Ax 1142. Address signals are received and decoded by a row decoder 1144 and a column decoder 1146 to access the memory array 1130. It will be appreciated by those skilled in the art, with the benefit of the present description, that the number of address input connections depends on the density and architecture of the memory array 1130. That is, the number of addresses increases with both increased memory cell counts and increased bank and block counts.

The memory device 1100 reads data in the memory array 1130 by sensing voltage or current changes in the memory array columns using sense/buffer circuitry 1150. The sense/buffer circuitry, in one embodiment, is coupled to read and latch a row of data from the memory array 1130. Data input and output buffer circuitry 1160 is included for bi-directional data communication over a plurality of data connections 1162 with the controller 1110). Write circuitry 1155 is provided to write data to the memory array.

Control circuitry 1170 decodes signals provided on control connections 1172 from the processor 1110. These signals are used to control the operations on the memory array 1130, including data read, data write, and erase operations. The control circuitry 1170 may be a state machine, a sequencer, or some other type of controller.

Since the NROM memory cells of the present invention use a CMOS compatible process, the memory device 1100 of FIG. 11 may be an embedded device with a CMOS processor.

The flash memory device illustrated in FIG. 11 has been simplified to facilitate a basic understanding of the features of the memory. A more detailed understanding of internal circuitry and functions of flash memories are known to those skilled in the art.

CONCLUSION

In summary, the NROM flash memory cells of the present invention utilize ultra-thin SOI to provide a fully depleted body region. This eliminates the undesirable floating body effects experienced by partially depleted CMOS devices.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for fabricating a memory array comprising a plurality of vertical NROM memory cells, the method comprising:

forming a first plurality of doped regions in a substrate such that a gap exists between each doped region, the doped regions having a different conductivity type than the substrate;

forming an oxide pillar over the gap between the doped regions;

forming an ultra-thin silicon body region extending from each doped region along opposing sidewalls of the oxide pillar;

forming a second plurality of doped regions in a polysilicon material over the oxide pillar and body regions such that the doped regions over the pillar are electrically coupled and have the same conductivity type as the first plurality of doped regions;

forming a gate insulator layer over the first plurality of doped regions, the body regions, and the second plurality of doped regions; and forming a polysilicon gate area over the gate insulator adjacent to each of the body regions.

2. The method of claim 1 wherein the forming of the polysilicon control gate area includes forming the control gate as a continuous layer over the gate insulator.

3. The method of claim 1 wherein the doped regions are n+ source and drain regions and the substrate is a p-type substrate.

4. The method of claim 1 wherein the silicon body regions are formed by epitaxial regrowth.

5. The method of claim 3 wherein whether a doped region is a source or a drain region depends on biasing of the memory cell.

6. The method of claim 1 wherein the memory array is fabricated in a NOR configuration.

7. The method of claim 1 wherein the memory array is fabricated in a NAND configuration.

8. The method of claim 1 wherein the substrate is a n-type substrate.

9. The method of claim 8 wherein the doped regions are p+ source and drain regions.

10. The method of claim 1 wherein the gate insulator layer is a composite oxide-nitride-oxide layer.

11. A method for fabricating a memory array comprising a plurality of vertical NROM memory cells, the method comprising:

forming a first plurality of doped regions in a substrate, the doped regions having a different conductivity type than the substrate;

forming an oxide pillar over each doped region such that each end of each doped region extends beyond an adjacent sidewall of the oxide pillar;

forming an ultra-thin silicon body region by epitaxial regrowth extending from the ends of the doped regions and along opposing sidewalls of the oxide pillar;

forming a second plurality of doped regions in a polysilicon material over the oxide pillar and body regions such that the doped regions over the pillar are electrically coupled and have the same conductivity type as the first plurality of doped regions;

forming a gate insulator layer over the first plurality of doped regions, the body regions, and the second plurality of doped regions, the gate insulator layer having a lower layer, adjacent to each end of a doped region of the first plurality of doped regions, that has a thickness greater than remaining portions of the lower layer; and forming a polysilicon control gate area over the gate insulator adjacent to each of the body regions.

12. The method of claim 11 wherein the gate insulator layer is a composite oxide-nitride-oxide layer and the lower layer is the oxide layer.

13. The method of claim 11 wherein the lower layer is an oxide layer.

14. The method of claim 11 wherein the ultra-thin body regions are less than 100 nm thick.

15. The method of claim 11 wherein the first plurality of doped regions are coupled by similarly doped areas such that the first plurality of doped regions form a continuous doped region in the substrate.

16. The method of claim 15 wherein the continuous doped region is a common drain region.

17. The method of claim 15 wherein the continuous doped region is a common source region.

18. The method of claim 16 wherein the second plurality of doped regions is a common source region.

19. The method of claim 17 wherein the second plurality of doped regions second is a common drain region.

20. The method of claim 11 wherein the gate insulator layer wherein the insulator layer is formed such that the gate insulator layer is a non-composite insulating layer of a type taken from a group comprising: silicon oxynitride, silicon rich aluminum oxide, and silicon oxycarbide.

21. The method of claim 11 wherein the gate insulator layer is formed from a group of materials comprising: silicon rich oxides with inclusions of nanoparticles of silicon, and silicon oxide insulators with inclusions of nanoparticles of silicon carbide.

* * * * *